(12) United States Patent
Li et al.

(10) Patent No.: US 11,367,757 B2
(45) Date of Patent: Jun. 21, 2022

(54) OLED TOUCH DISPLAY SUBSTRATE, MANUFACTURING METHOD THEREOF AND TOUCH DISPLAY DEVICE

(71) Applicants: BOE TECHNOLOGY GROUP CO., LTD., Beijing (CN); HEFEI XINSHENG OPTOELECTRONICS TECHNOLOGY CO., LTD, Anhui (CN)

(72) Inventors: Jun Li, Beijing (CN); Qicheng Chen, Beijing (CN); Ming Zhang, Beijing (CN); Tsungchieh Kuo, Beijing (CN); Weijie Ma, Beijing (CN)

(73) Assignees: BOE TECHNOLOGY GROUP CO., LTD., Beijing (CN); HEFEI XINSHENG OPTOELECTRONICS TECHNOLOGY CO., LTD., Anhui (CN)

( * ) Notice: Subject to any disclaimer, the term of this patent is extended or adjusted under 35 U.S.C. 154(b) by 675 days.

(21) Appl. No.: 16/096,902

(22) PCT Filed: Apr. 4, 2018

(86) PCT No.: PCT/CN2018/081903
§ 371 (c)(1),
(2) Date: Oct. 26, 2018

(87) PCT Pub. No.: WO2018/210073
PCT Pub. Date: Nov. 22, 2018

(65) Prior Publication Data
US 2021/0225944 A1  Jul. 22, 2021

(30) Foreign Application Priority Data
May 18, 2017 (CN) .......................... 201710351900.4

(51) Int. Cl.
*H01L 27/32* (2006.01)
*G06F 3/044* (2006.01)
*G06F 3/041* (2006.01)

(52) U.S. Cl.
CPC .......... *H01L 27/323* (2013.01); *G06F 3/0412* (2013.01); *G06F 3/0446* (2019.05); *G06F 2203/04111* (2013.01)

(58) Field of Classification Search
CPC ............................................ G06F 2203/04111
See application file for complete search history.

(56) References Cited

U.S. PATENT DOCUMENTS

2016/0034076 A1* 2/2016 Chien .................. G06F 3/0446
                                                                345/173
2016/0109741 A1* 4/2016 Lee ..................... G06F 3/04184
                                                                349/12
(Continued)

FOREIGN PATENT DOCUMENTS

CN       101907944 A    12/2010
CN       104465695 A     3/2015
(Continued)

OTHER PUBLICATIONS

Search Report and Written Opinion for International Application No. PCT/CN2018/081903 dated Jul. 10, 2018.
(Continued)

*Primary Examiner* — Robin J Mishler
(74) *Attorney, Agent, or Firm* — Calfee, Halter & Griswold LLP

(57) ABSTRACT

The present disclosure relates to the field of display technologies, and provides in embodiments an OLED touch display substrate, a manufacturing method thereof and a corresponding touch display device. Specifically, the OLED touch display substrate comprises: a first electrode layer and a second electrode layer opposite to each other; an organic
(Continued)

layer between the first electrode layer and the second electrode layer; a touch layer on a side of the second electrode layer facing away from the organic layer; and a first insulating layer between the touch layer and the second electrode layer. The second electrode layer is a transparent electrode layer.

4 Claims, 5 Drawing Sheets

(56) References Cited

U.S. PATENT DOCUMENTS

2018/0196561 A1\* 7/2018 Kim .................. G06F 3/0445
2018/0348924 A1 12/2018 Li et al.

FOREIGN PATENT DOCUMENTS

| CN | 104637976 A | 5/2015 |
| CN | 205752176 U | 11/2016 |
| CN | 106201142 A | 12/2016 |
| CN | 106354338 A | 1/2017 |
| CN | 106569633 A | 4/2017 |
| CN | 107193415 A | 9/2017 |

OTHER PUBLICATIONS

First Office Action for Chinese Patent Application No. 201710351900.4 dated Feb. 27, 2019.

\* cited by examiner

OLED TOUCH DISPLAY SUBSTRATE, MANUFACTURING METHOD THEREOF AND TOUCH DISPLAY DEVICE

The present application is the U.S. national phase entry of PCT/CN2018/081903 field on Apr. 4, 2018, which claims the priority of the Chinese patent application No. 201710351900.4 filed on May 18, 2017, the entire disclosures of both are incorporated herein by reference.

TECHNICAL FIELD

The present disclosure relates to the field of display technologies, and specifically provides an OLED touch display substrate, a manufacturing method thereof, and a corresponding touch display device.

BACKGROUND ART

Organic light-emitting diode (OLED) display devices have attracted more and more consumers by virtue of their advantages, such as self-luminance, fast response, wide view angle, flexibility, light weight, and thinness. An OLED touch display device provides an OLED display device with a touch control function. Accordingly, inputs can be provided through fingers, stylus and so on, which makes operations more intuitive and more convenient. In view of above, OLED touch display devices have been widely applied in the market of smart phones and wearable devices, etc.

A top-emitting OLED touch display device is taken as an example. A cathode of an OLED touch display device is generally a metal with a thin thickness, for example, active metals such as aluminum, magnesium and copper. As a result, such metals can easily react with vapor and oxygen permeating the OLED touch display device, which will affect the injection of charges into an organic layer. Moreover, chemical reactions may also occur between the vapor and oxygen permeating the OLED touch display device and the organic layer, which may probably impair the performance of the OLED touch display device.

SUMMARY

According to one aspect of the present disclosure, an OLED touch display substrate is provided. Specifically, the OLED touch display substrate comprises: a first electrode layer and a second electrode layer arranged opposite to each other; an organic layer arranged between the first electrode layer and the second electrode layer; a touch layer arranged on a side of the second electrode layer facing away from the organic layer; and a first insulating layer arranged between the touch layer and the second electrode layer. The second electrode layer is a transparent electrode layer. The touch layer comprises: a first protective layer; a plurality of first touch electrodes and a plurality of second touch electrodes arranged on a side of the first protective layer facing the first insulating layer or facing away from the first insulating layer, the plurality of first touch electrodes extending in a first direction, and the plurality of second touch electrodes extending in a second direction different from the first direction, wherein each first touch electrode comprises a plurality of first sub-touch electrodes connected directly to each other, and each second touch electrode comprises a plurality of second sub-touch electrodes arranged at intervals; and a plurality of bridges located respectively at a plurality of intersections between the first touch electrodes and the second touch electrodes and arranged further on a side of the first protective layer opposite to the first touch electrodes and the second touch electrodes, each bridge penetrating through a via hole in the first protective layer to electrically connect two adjacent second sub-touch electrodes.

According to a specific implementation, in the OLED touch display substrate provided by an embodiment of the present disclosure, the first protective layer is made of an inorganic material.

According to a specific implementation, in the OLED touch display substrate provided by an embodiment of the present disclosure, the first protective layer is made of an organic material. Furthermore, the OLED touch display substrate further comprises: a second insulating layer arranged on a side of the touch layer facing away from the first insulating layer, wherein the first insulating layer and the second insulating layer are both made of an inorganic material.

According to a specific implementation, the OLED touch display substrate provided by an embodiment of the present disclosure further comprises: a second protective layer arranged on a side of the first touch electrodes and the second touch electrodes facing away from the first protective layer. Furthermore, the second protective layer is further located between the first insulating layer and the second insulating layer, and made of an organic material.

According to a specific implementation, the OLED touch display substrate provided by an embodiment of the present disclosure further comprises: a polarizer arranged on a side of the touch layer facing away from the first insulating layer.

According to another aspect of the present disclosure, a touch display device is further provided. Specifically, the touch display device comprises: the OLED touch display substrate provided in any of the above embodiments; and an encapsulation cover plate, wherein the OLED touch display substrate and the encapsulation cover plate are bonded via a layer of optical clear adhesive.

According to yet another aspect of the present disclosure, a manufacturing method for an OLED touch display substrate is further provided. Specifically, the manufacturing method comprises: forming a first electrode layer on a base substrate; forming an organic layer on the first electrode layer; forming a second electrode layer on the organic layer, the second electrode layer being a transparent electrode layer; forming a first insulating layer on the second electrode layer; and forming a touch layer on the first insulating layer. Furthermore, the touch layer comprises: a first protective layer; a plurality of first touch electrodes and a plurality of second touch electrodes arranged on a side of the first protective layer facing the first insulating layer or facing away from the first insulating layer, the plurality of first touch electrodes extending in a first direction, and the plurality of second touch electrodes extending in a second direction different from the first direction, wherein each first touch electrode comprises a plurality of first sub-touch electrodes connected directly to each other, and each second touch electrode comprises a plurality of second sub-touch electrodes arranged at intervals; and a plurality of bridges located respectively at a plurality of intersections between the first touch electrodes and the second touch electrodes and arranged further on a side of the first protective layer opposite to the first touch electrodes and the second touch electrodes, each bridge penetrating through a via hole in the first protective layer to electrically connect two adjacent second sub-touch electrodes.

According to a specific implementation, in the manufacturing method for an OLED touch display substrate provided by an embodiment of the present disclosure, the first insulating layer is made of an inorganic material, and the first protective layer is made of an organic material. Furthermore, the manufacturing method further comprises: after forming the touch layer, forming a second insulating layer on the touch layer, wherein the second insulating layer is made of an inorganic material.

According to a specific implementation, in the manufacturing method for an OLED touch display substrate provided by an embodiment of the present disclosure, the step of forming the touch layer comprises: forming a plurality of first touch electrodes extending in a first direction and a plurality of second touch electrodes extending in a second direction different from the first direction, wherein each first touch electrode comprises a plurality of first sub-touch electrodes connected directly to each other, and each second touch electrode comprises a plurality of second sub-touch electrodes arranged at intervals; forming a first protective layer covering the plurality of first touch electrode and the plurality of second touch electrode; and forming a plurality of bridges on the first protective layer, each bridge penetrating through a via hole in the first protective layer to electrically connect two adjacent second sub-touch electrodes. Furthermore, the manufacturing method further comprises: after forming the first insulating layer and before forming the touch layer, forming a second protective layer on the first insulating layer, wherein the second protective layer is made of an organic material.

According to a specific implementation, in the manufacturing method for an OLED touch display substrate provided by an embodiment of the present disclosure, the step of forming the touch layer comprises: forming a plurality of bridges; forming a first protective layer over the plurality of bridges; and forming on the first protective layer a plurality of first touch electrodes extending in a first direction and a plurality of second touch electrodes extending in a second direction different from the first direction, wherein each first touch electrode comprises a plurality of first sub-touch electrodes connected directly to each other, each second touch electrode comprises a plurality of second sub-touch electrodes arranged at intervals, and two adjacent second sub-touch electrodes are electrically connected via a bridge. Furthermore, the method further comprises: after forming the touch layer and before forming the second insulating layer, forming a second protective layer on the touch layer, wherein the second protective layer is made of an organic material.

BRIEF DESCRIPTION OF DRAWINGS

In order to illustrate technical solutions in embodiments of the present disclosure more clearly, drawings used in the embodiments will be briefly introduced as follows. Apparently, drawings in the following depictions are only some embodiments of the present disclosure. For a person having ordinary skills in the art, other embodiments can also be obtained from the embodiments shown in these drawings without any inventive effort.

DETAILED DESCRIPTION OF EMBODIMENTS

The technical solutions in embodiments of the present disclosure shall be described clearly and completely as follows with reference to the drawings in embodiments of the present disclosure. Apparently, the embodiments as described below are only part of the embodiments of the present disclosure, rather than all of them. Based on the embodiments in the present disclosure, all other embodiments obtainable by a person having ordinary skills in the art without any inventive effort shall fall within the protection scope of the present disclosure.

Figure 1:
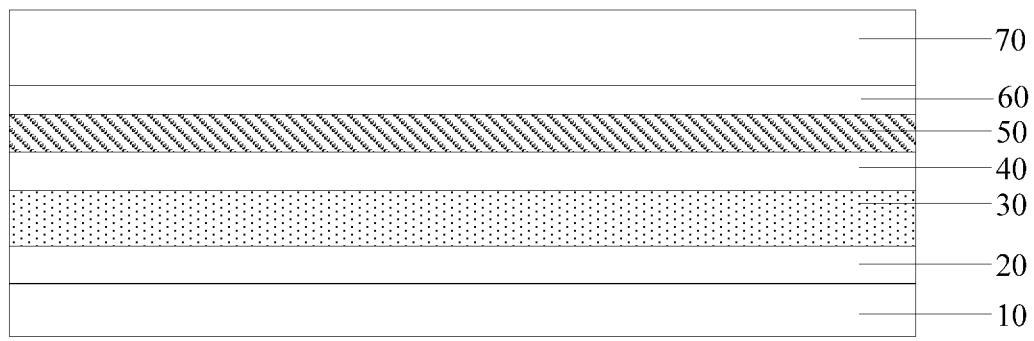
FIG. 1 is a schematic structure view of a touch display substrate according to a relevant art.

Referring to FIG. 1, an OLED touch display device according to a relevant art is shown. Specifically, as shown in FIG. 1, in order to obtain an OLED touch display device, firstly, an anode 20, an organic layer 30 and a cathode 40 are fabricated on a base substrate 10, and after that, a thin film encapsulation (TFE) 50 is fabricated on the cathode 40. Typically, the TFE 50 is made of two or more thin films. In this way, the drive circuit and the organic layer 30 in the OLED touch display device are isolated from outside by the TFE 50, which prevents the permeation of vapor and oxygen from outside and improves the service life of the OLED touch display device. After the fabrication of TFE 50, a substrate 70 with a touch layer provided thereon is bonded to the TFE 50 by means of a layer of optical clear adhesive (COA) 60.

However, in the above relevant art, it is required to provide the OLED touch display device with a TFE 50 while fabricating a touch layer, the entire thickness of the OLED touch display device is increased, which is unfavorable for the minimization of OLED touch display devices.

Figure 2:
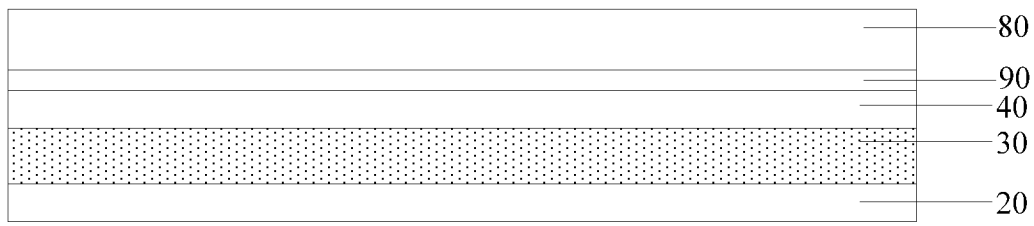
FIG. 2 is a schematic structure view of a touch display substrate according to an embodiment of the present disclosure.

An OLED touch display substrate is provided in an embodiment of the present disclosure. As shown in FIG. 2, the OLED touch display substrate comprises a first electrode layer 20, a second electrode layer 40, as well as an organic layer 30 arranged between the first electrode layer 20 and the second electrode layer 40. Specifically, the second electrode layer 40 is a transparent electrode layer. Those skilled in the art will understand that transparency can be realized by making the cathode material to be thin.

According to a specific embodiment, the organic layer 30 can comprise only a light emitting layer. Alternatively, according to a further embodiment, the organic layer 30 can not only comprise a light emitting layer, but also at least one of an electron injection layer, an electron transport layer, a hole injection layer and a hole transport layer. Besides, the organic layer 30 can emit white light, or light of three primary colors, e.g., red light, green light and blue light. When the organic layer 30 emits white light, the OLED touch display substrate can further comprise a color film layer.

Herein, in a specific embodiment, the first electrode layer 20 can be an anode, and the second electrode layer 40 can be a cathode. Alternatively, in a further embodiment, the first electrode layer 20 can be a cathode, and the second electrode layer 40 can be an anode. Since the second electrode layer 40 is a transparent electrode layer, light emitted from the organic layer 30 can be emitted out from the second electrode layer 40.

Continuing with the above example, according to a specific embodiment, it can be the first electrode layer 20 that comprises a plurality of sub-electrodes independent of each other. Alternatively, in a further embodiment, it can also be the second electrode layer 40 that comprises a plurality of sub-electrodes independent of each other. When the OLED touch display substrate further comprises a thin film transistor, the thin film transistor comprises a source, a drain, an active layer, a gate and a gate insulating layer, wherein the drain is electrically connected to the sub-electrodes.

Figure 3A:
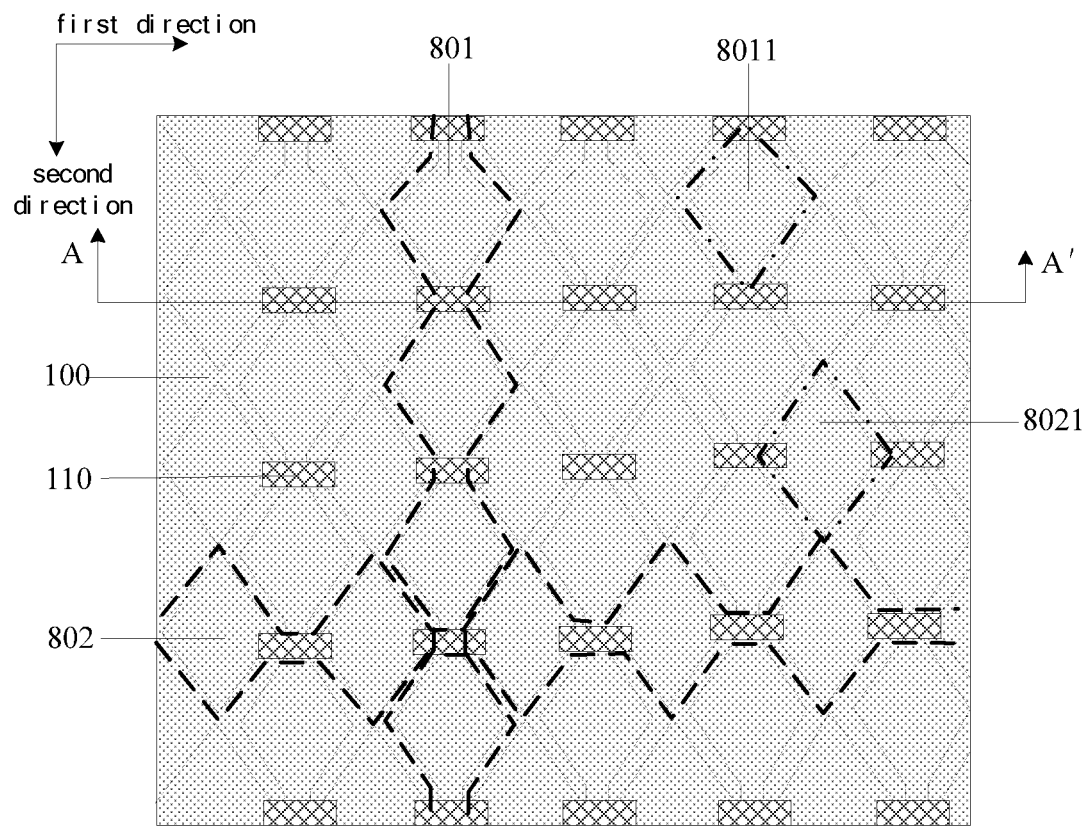
FIG. 3(a) is a schematic structure top view of a touch display substrate according to an embodiment of the present disclosure.
Figure 3B:
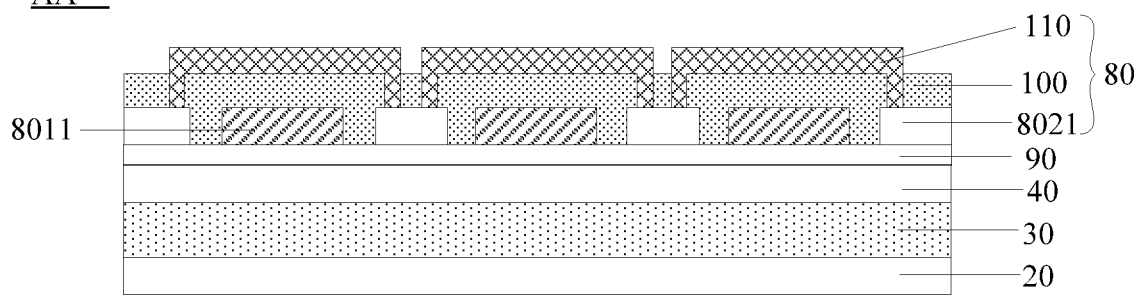
FIG. 3(b) is a schematic structure section view taken along the line AA' in FIG. 3(a)
Figure 4:
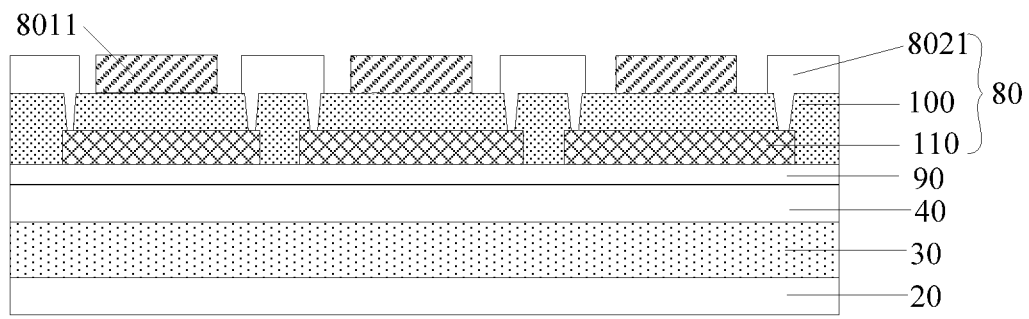
FIG. 4 is a schematic structure view of a touch display substrate according to an embodiment of the present disclosure.

The OLED touch display substrate further comprises a touch layer 80 arranged on a side of the second electrode layer 40 facing away from the organic layer 30, and a first insulating layer 90 arranged between the touch layer 80 and the second electrode layer 40. As shown in FIGS. 3(a), 3(b) and 4, specifically, the touch layer 80 comprises: a plurality of first touch electrodes 801 extending in a first direction and a plurality of second touch electrodes 802 extending in a second direction. Furthermore, the first touch electrode 801 comprises a plurality of first sub-touch electrodes 8011 connected directly to each other, and the second touch electrode 802 comprises a plurality of second sub-touch electrodes 8021 arranged at intervals. Besides, the touch layer 80 can further comprise a first protective layer 100, wherein the first protective layer 100 covers an upper surface (e.g., FIG. 3(b)) or a lower surface (e.g., FIG. 4) of the first touch electrodes 801 and the second touch electrodes 802. Apart from that, the touch layer 80 can further comprise a plurality of bridges 110 arranged on a surface of the first protective layer 100 opposite to the first touch electrodes 801 and the second touch electrodes 802. Furthermore, the plurality of bridges 110 are located respectively at a plurality of intersections between the first touch electrodes 801 and the second touch electrodes 802, and each bridge penetrates through a via hole in the first protective layer 100 to electrically connect two adjacent second sub-touch electrodes 8021.

It should be noted that in a specific embodiment, the first touch electrode 801 can be a driving electrode and the second touch electrode 802 can be a sensing electrode. Alternatively, according to a further embodiment, the first touch electrode 801 can be a sensing electrode and the second touch electrode 802 can be a driving electrode.

Herein, in order to avoid influences on the normal display of OLED touch display substrate, the first touch electrode 801 and the second touch electrode 802 are both transparent electrode layers. As an example, materials for the first touch electrode 801 and the second touch electrode 802 can be at least one of indium tin oxide (ITO), indium zinc oxide (IZO), and indium gallium zinc oxide (IGZO).

It should be further noted that materials for the first protective layer 100 can be either an organic material or an inorganic material.

In this case, the first protective layer 100 is provided with via holes, through which the bridges 110 can penetrate to electrically connect adjacent second sub-touch electrodes 8021. Therefore, in order to improve the accuracy in dimension and position of the via holes formed in the first protective layer 100, in an embodiment of the present disclosure, optionally, materials for the first protective layer 100 have a high degree of resolution.

Furthermore, it should be further pointed out that materials for the bridge 110 can be a metal or a metal oxide.

Besides, materials for the bridge 110 can be the same as or different from materials for the first touch electrode 801 and the second touch electrode 802.

In addition, it should be emphasized that the forming sequence of each layer in the touch layer 80 can also be selected flexibly upon actual situations. For example, it can be the case as shown in FIG. 3(b), in which the first touch electrodes 801 and the second touch electrodes 802, the first protective layer 100, as well as the bridges 110 are formed sequentially on the first insulating layer 90. Alternatively, it can also be the case as shown in FIG. 4, in which the bridges 110, the first protective layer 100, as well as the first touch electrodes 801 and the second touch electrodes 802 are formed sequentially on the first insulating layer 90.

Furthermore, it should be further noted that, the first insulating layer 90 can be formed of various materials, as long as it can insulate the touch layer 80 from the second electrode layer 40. As an example, materials for the first insulating layer 90 can be either an organic material or an inorganic material.

Finally, it should be further pointed out that the structure of touch layer 80 in a conventional solution is different from the structure of touch layer 80 in the embodiments of the present disclosure. Specifically, in the conventional solution, a first protective layer is formed only at intersections between the first touch electrodes and the second touch electrodes. This means that the traditional first protective layer only partially covers the first touch electrodes and second touch electrodes, and cannot encapsulate the entire touch layer. However, in contrast, in an embodiment of the present disclosure, the first protective layer covers all of the first touch electrodes and the second touch electrodes. Thus, the first protective layer can also be used for encapsulation at the same time, thereby facilitating the exclusion of vapor and oxygen.

An OLED touch display substrate is provided in an embodiment of the present disclosure. In such an OLED touch display substrate, the first protective layer 100 in the touch layer 80 covers the first touch electrodes 801 and the second touch electrodes 802, while the touch layer 80 is arranged on a side of the second electrode layer 40 facing away from the organic layer 30. In this way, the first protective layer 100 will cover the second electrode layer 40, the first electrode layer 20 and the organic layer 30. Accordingly, the touch layer 80 can isolate the second electrode layer 40, the first electrode layer 20 and the organic layer 30, thereby preventing vapor and oxygen from permeating and influencing the performance of OLED touch display substrate. As can be seen, in an embodiment of the present disclosure, the touch layer 80 can also achieve the function of encapsulation together with the first insulating layer 90 in addition to the touch control function. Therefore, no extra thin film encapsulation is needed on the OLED touch display substrate. In this way, the thickness of OLED touch display substrate can be reduced, the number of production processes can be decreased, and the production cost can be cut down.

Furthermore, according to an embodiment of the present disclosure, the touch layer 80 is directly fabricated on the first insulating layer 90. In contrast with the relevant art, where the touch layer 80 is fabricated on the substrate, and then the substrate on which the touch layer 80 has been fabricated is bonded onto the second electrode layer 40 by a layer of optical clear adhesive. No substrate or layer of optical clear adhesive is needed in the embodiments of the present disclosure. Thus, the thickness of OLED touch display substrate is further reduced. Besides, as compared with the conventional solution where glass is used for encapsulation, in an embodiment of the present disclosure, multiple layers of thin film are used for encapsulation. Therefore, the OLED touch display substrate is flexible. Besides, a reduced thickness of the OLED touch display substrate is more favorable to the bending of OLED touch display substrate, thus improving the flexibility of OLED touch display substrate.

Due to the good compactness of inorganic materials, in an embodiment of the present disclosure, optionally, the material for the first protective layer 100 is an inorganic material. Furthermore, since $SiN_x$, $SiO_x$ and $SiO_xN_y$ have better compactness as compared with other inorganic materials, when the material for the first protective layer 100 is an inorganic material, in an embodiment of the present disclosure, advantageously, the material for the first protective layer 100 can be at least one of $SiN_x$, $SiO_x$ and $SiO_xN_y$.

Figure 5:
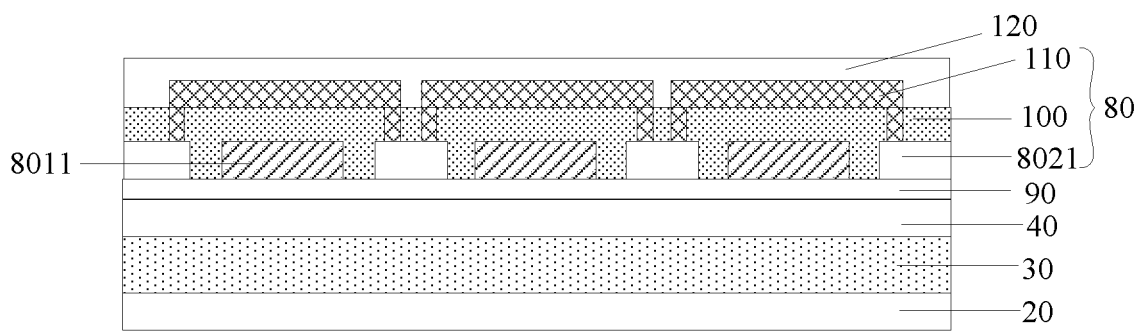
FIG. 5 is a schematic structure view of a touch display substrate according to an embodiment of the present disclosure.

Optionally, as shown in FIG. 5, the material for the first protective layer 100 is an organic material. Besides, the OLED touch display substrate further comprises a second insulating layer 120 arranged on a side of the touch layer 80 facing away from the first insulating layer 90, wherein the materials for the first insulating layer 90 and the second insulating layer 120 are both inorganic materials.

In this case, the materials for the first insulating layer 90 and the second insulating layer 120 can be either the same or different.

Herein, since $SiN_x$, $SiO_x$ and $SiO_xN_y$ have better compactness as compared with other inorganic materials, in an embodiment of the present disclosure, the materials for the first insulating layer 90 and the second insulating layer 120 are optionally at least one of $SiN_x$, $SiO_x$ and $SiO_xN_y$.

In an embodiment of the present disclosure, the material for the first protective layer 100 is an organic material, while the materials for the first insulating layer 90 and the second insulating layer 120 are inorganic materials. Thereby, an inorganic-organic-inorganic stack structure can be formed. With the outermost layers made of inorganic materials having better compactness and the middle layer made of an organic material, such an inorganic-organic-inorganic stack structure can effectively prevent the permeation of vapor, and thus ensures the service life of OLED touch display substrate.

Figure 6A:
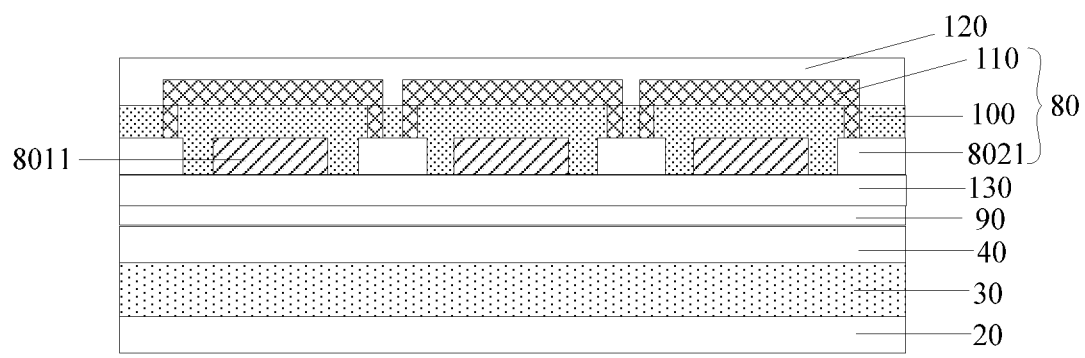
FIG. 6(a) is a schematic structure view of a touch display substrate according to an embodiment of the present disclosure.
Figure 6B:
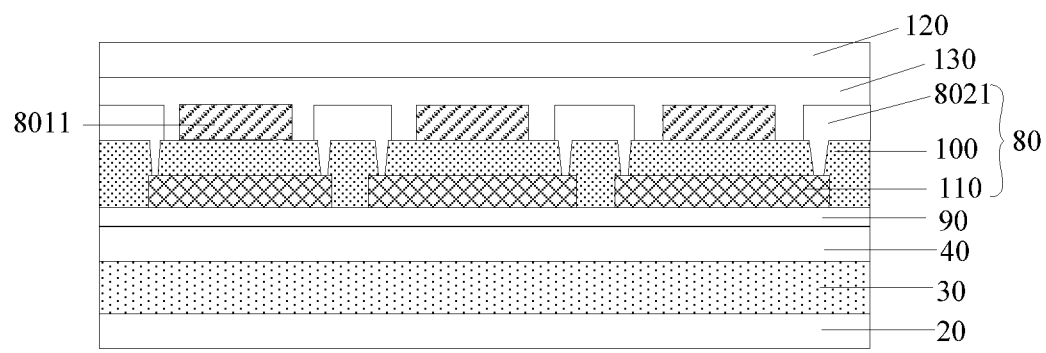
FIG. 6(b) is a schematic structure view of a touch display substrate according to an embodiment of the present disclosure.

Further optionally, as shown in FIGS. 6(a) and 6(b), the OLED touch display substrate further comprises a second protective layer 130, which is arranged on a side of the first touch electrodes 801 and the second touch electrodes 802 facing away from the first protective layer 100, and further sandwiched between the first insulating layer 90 and the second insulating layer 120. Specifically, the material for the second protective layer 130 is an organic material.

In this case, as shown in FIG. 6(a), the first insulating layer 90, the second protective layer 130, the first touch electrodes 801 and the second touch electrodes 802, the first protective layer 100, the bridges 110, as well as the second insulating layer 120 can be formed sequentially on the second electrode layer 40. Optionally, as shown in FIG. 6(b), the first insulating layer 90, the bridges 110, the first protective layer 100, the first touch electrodes 801 and the second touch electrodes 802, the second protective layer 130, as well as the second insulating layer 120 can be formed sequentially on the second electrode layer 40.

Herein, the materials for the second protective layer 130 and the first protective layer 100 can be either the same or different. The present disclosure is not limited thereto in this aspect.

It should be noted that, in an embodiment of the present disclosure, the function of a conventional thin film encapsulation can be achieved by varying the thickness and material components of the first protective layer 100, the second protective layer 130, the first insulating layer 90 or the second insulating layer 120, as well as the thickness or shape of the first touch electrodes 801 and the second touch electrodes 802.

In an embodiment of the present disclosure, the materials for the first insulating layer 90, the second insulating layer 120, the first touch electrodes 801 and the second touch electrodes 802 are all inorganic materials, while the materials for the first protective layer 100 and the second protective layer 130 are both organic materials. Therefore, no matter whether the OLED touch display substrate is structured in a manner of first insulating layer 90-second protective layer 130-first touch electrodes 801 and second touch electrodes 802-first protective layer 100-second insulating layer 120, or in a manner of first insulating layer 90-first protective layer 100-first touch electrodes 801 and second touch electrodes 802-second protective layer 130-second insulating layer 120, the OLED touch display substrate will have an inorganic-organic-inorganic-organic-inorganic stack structure. In the stack structure, the outermost layers are made of inorganic materials having better compactness and the middle layers are made of organic materials. The stack structure of inorganic-organic alternating multilayer can exclude vapor and oxygen more effectively, and hence greatly enhances the barrier properties against vapor and oxygen.

Figure 7:
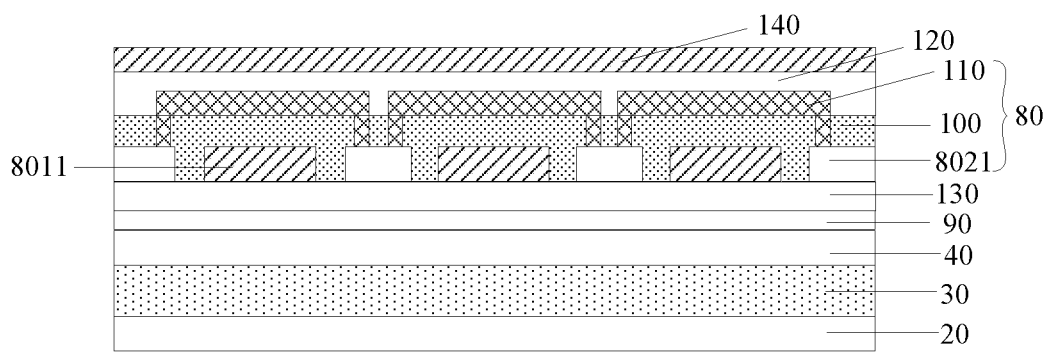
FIG. 7 is a schematic structure view of a touch display substrate according to an embodiment of the present disclosure.

Optionally, as shown in FIG. 7, the OLED touch display substrate further comprises a polarizer (POL for short) 140 arranged on a side of the touch layer 80 facing away from the second electrode layer 40.

Specifically, the polarizer 140 can have a thickness of 55 µm-148 µm. Further optionally, the polarizer 140 can have a thickness of 114 µm.

In an embodiment of the present disclosure, by arranging the polarizer 140 on the OLED touch display substrate, the view angle of the OLED touch display device can be increased, and thus the display effect of the OLED touch display device can be improved.

Figure 8:
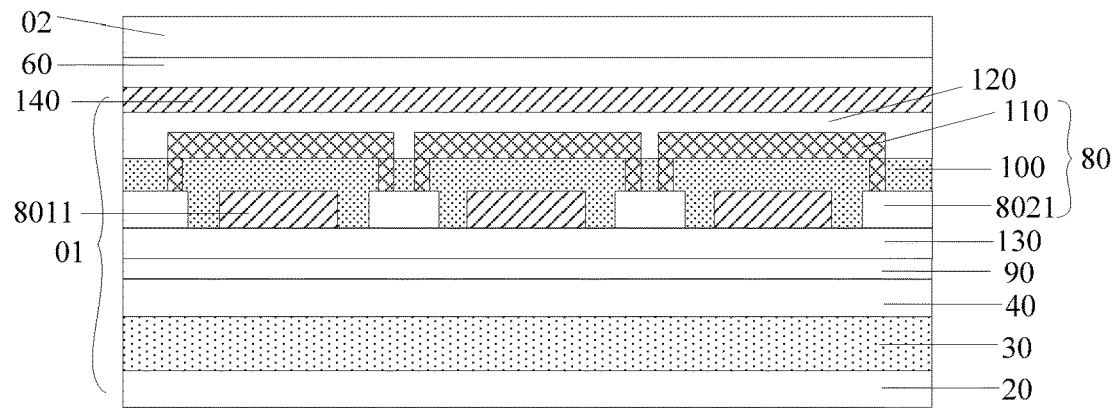
FIG. 8 is a schematic structure view of a touch display device according to an embodiment of the present disclosure.

A touch display device is further provided in an embodiment of the present disclosure. As shown in FIG. 8, the touch display device comprises the above described OLED touch display substrate 01 and an encapsulation cover plate 02, such as a cover glass. Specifically, the OLED touch display substrate 01 and the encapsulation cover plate 02 are bonded via a layer of optical clear adhesive 60.

Herein, the thickness of the layer of optical clear adhesive 60 can be flexibly selected upon actual needs. Optionally, the layer of optical clear adhesive 60 can have a thickness of 100 µm-250 µm, and further optionally, the layer of optical clear adhesive 60 can have a thickness of 100 µm.

The touch display device provided by an embodiment of the present disclosure can be any device for displaying motion pictures (e.g., videos), fixed pictures (e.g., still images), characters or the like. More specifically, embodiments can be applied in multiple electronic devices, or associated with multiple electronic devices. The multiple electronic devices comprise for example, but are not limited to, a mobile phone, a wireless device, a personal data assistant (PDA), a hand-held or portable computer, a GPS receiver or navigator, a camera, an MP4 video player, a video camera, a game console, a watch, a clock, a calculator, a TV monitor, a tablet display, a computer monitor, an automobile display (e.g., odometer display etc.), a navigator, a cabin controller and/or display, a display for camera views (e.g., a display for rear-view cameras in vehicles), an electronic photo, an electronic billboard or sign, a projector, an architectural structure, a packaging and aesthetic structure (e.g., a display for displaying images of jewelries), and so on. Besides, the touch display device can also be a touch display panel.

A touch display device is further provided in an embodiment of the present disclosure. Specifically, in such an OLED touch display device, the first protective layer 100 in the touch layer 80 covers the first touch electrodes 801 and the second touch electrodes 802, while the touch layer 80 is arranged on a side of the second electrode layer 40 facing away from the organic layer 30. In this way, the first protective layer 100 can cover the first electrode layer 20, the second electrode layer 40, and the organic layer 30. Accordingly, the touch layer 80 can isolate the first electrode layer 20, the second electrode layer 40, and the organic layer 30, thereby preventing vapor and oxygen from permeating and influencing the performance of OLED touch display substrate. Since the touch layer 80 in an embodiment of the present disclosure can also achieve the function of encapsulation together with the first insulating layer 90 in addition to the touch control function, no extra thin film encapsulation is needed on the OLED touch display substrate. In this way, the thickness of OLED touch display device can be reduced, the number of production processes can be decreased, and the production cost can be cut down.

Furthermore, in an embodiment of the present disclosure, the touch layer 80 is directly fabricated on the first insulating layer 90. In contrast with the relevant art, where the touch layer 80 is fabricated on the substrate first, and then the substrate 70 on which the touch layer 80 has been fabricated is bonded onto the second electrode layer 40 by a layer of optical clear adhesive. No substrate or layer of optical clear adhesive is needed in the embodiments of the present disclosure. Thus, the thickness of the OLED touch display device is further reduced, which facilitates an ultra-thin design and improves the flexibility of the touch display device.

Figure 9:
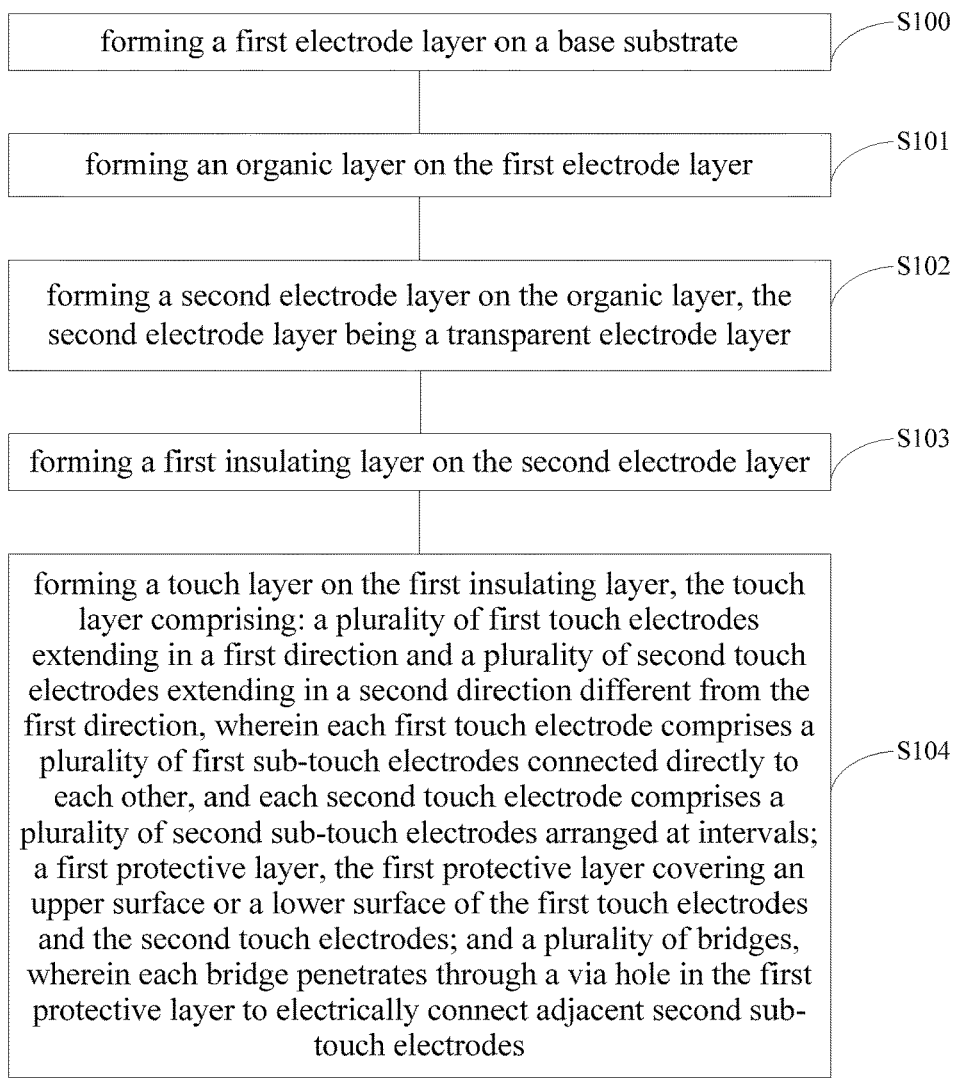
FIG. 9 is a schematic flow chart of a manufacturing method for a touch display substrate according to an embodiment of the present disclosure.

A manufacturing method for an OLED touch display substrate is further provided in an embodiment of the present disclosure. As shown in FIG. 9, the manufacturing method comprises steps as follows.

Figure 10:
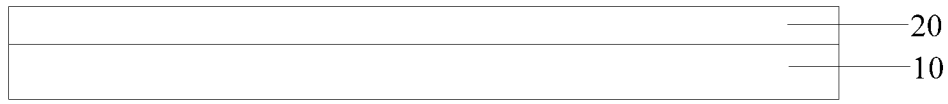
FIG. 10 is a schematic structure view taken when a first electrode layer is formed on a base substrate according to an embodiment of the present disclosure.

S100, as shown in FIG. 10, a first electrode layer 20 is formed on a base substrate 10.

Specifically, the base substrate 10 can be a glass substrate or a plastic substrate, but the present disclosure is not limited thereto in this aspect.

Figure 11:
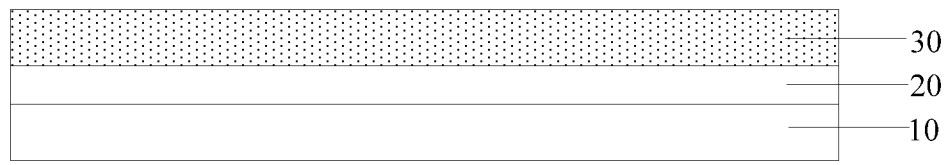
FIG. 11 is a schematic structure view taken when an organic layer is formed on the first electrode layer according to an embodiment of the present disclosure.

S101, as shown in FIG. 11, an organic layer 30 is formed on the first electrode layer 20.

Specifically, the organic layer 30 can comprise only a light emitting layer. Alternatively, the organic layer 30 can not only comprise a light emitting layer, but also at least one of an electron injection layer, an electron transport layer, a hole injection layer and a hole transport layer. Besides, the organic layer 30 can emit white light, or light of three primary colors, e.g., red light, green light and blue light. When the organic layer 30 emits white light, the OLED touch display substrate can further comprise a color film layer.

Figure 12:
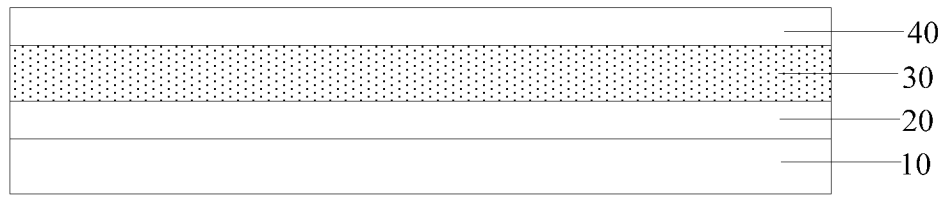
FIG. 12 is a schematic structure view taken when a second electrode layer is formed on the organic layer according to an embodiment of the present disclosure.

S102, as shown in FIG. 12, a second electrode layer 40 is formed on the organic layer 30, wherein the second electrode layer 40 is a transparent electrode layer.

Herein, since the second electrode layer 40 is a transparent electrode layer, light emitted from the organic layer 30 can be emitted out from the second electrode layer 40.

Specifically, the first electrode layer 20 can be an anode and the second electrode layer 40 can be a cathode. Alternatively, the first electrode layer 20 can be a cathode and the second electrode layer 40 can be an anode. In view of above, it can be the first electrode layer 20 that comprises a plurality of sub-electrodes independent of each other, or the second electrode layer 40 that comprises a plurality of sub-electrodes independent of each other.

Figure 13:
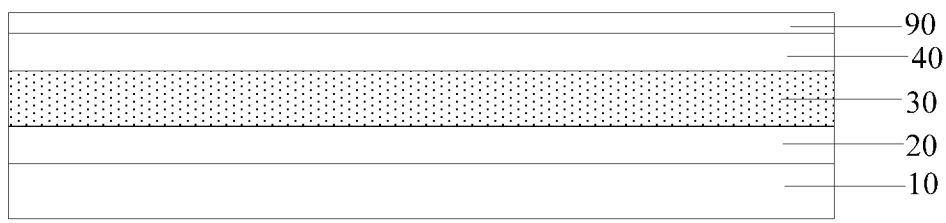
FIG. 13 is a schematic structure view taken when a first insulating layer is formed on the second electrode layer according to an embodiment of the present disclosure.

S103, as shown in FIG. 13, a first insulating layer 90 is formed on the second electrode layer 40.

Specifically, the first insulating layer 90 can be made of any suitable material, such as organic material, inorganic material or the like.

Figure 14:
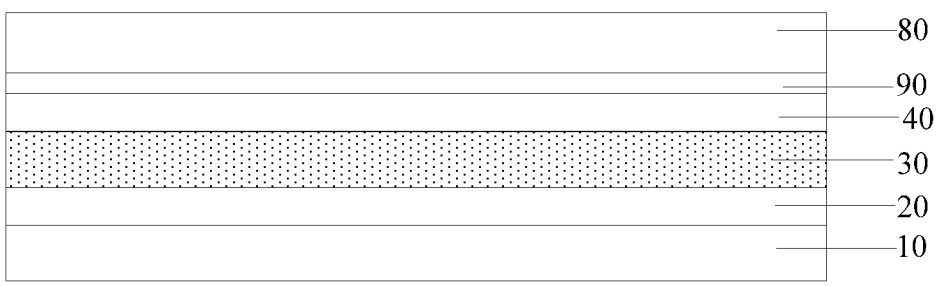
FIG. 14 is a schematic structure view taken when a touch layer is formed on the first insulating layer according to an embodiment of the present disclosure.

S104, as shown in FIG. 14, a touch layer 80 is formed on the first insulating layer 90. Specifically, the touch layer 80 comprises: a plurality of first touch electrodes 801 extending in a first direction and a plurality of second touch electrodes 802 extending in a second direction, wherein each first touch electrode 801 comprises a plurality of first sub-touch electrodes 8011 connected directly to each other, and each second touch electrode 802 comprises a plurality of second sub-touch electrodes 8021 arranged at intervals; a first protective layer 100, the first protective layer 100 covering an upper surface or a lower surface of the first touch electrodes 801 and the second touch electrodes 802; a plurality of bridges 110, wherein each bridge 110 penetrates through a via hole in the first protective layer 100 to electrically connect adjacent second sub-touch electrodes 8021. In the above embodiment, the first direction is different from the second direction. For example, the first direction is perpendicular to the second direction.

As an example, the first touch electrode 801 can be a driving electrode and the second touch electrode 802 can be a sensing electrode. Alternatively, the first touch electrode 801 can be a sensing electrode and the second touch electrode 802 can be a driving electrode.

Herein, the forming sequence of each layer in the touch layer 80 can be selected flexibly upon actual needs. For example, the first touch electrodes 801 and the second touch electrodes 802, the first protective layer 100, as well as the plurality of bridges 110 can be formed sequentially on the first insulating layer 90. Alternatively, the bridges 110, the first protective layer 100, as well as the first touch electrodes 801 and the second touch electrodes 802 can be formed sequentially on the first insulating layer 90.

Besides, in an embodiment of the present disclosure, the first protective layer 100 is provided with via holes, through which the bridges 110 can penetrate to electrically connect adjacent second sub-touch electrodes 8021. Therefore, in order to improve the accuracy in dimension and position of the via holes formed in the first protective layer 100, in an embodiment of the present disclosure, the material for the first protective layer 100 has optionally a high degree of resolution.

A manufacturing method for an OLED touch display substrate is provided in an embodiment of the present disclosure. Specifically, the first protective layer 100 in the touch layer 80 covers the first touch electrodes 801 and the second touch electrodes 802, while the touch layer 80 is arranged on a side of the second electrode layer 40 facing away from the organic layer 30. In this way, the first protective layer 100 can cover the first electrode layer 20, the second electrode layer 40, and the organic layer 30. Accordingly, the touch layer 80 can isolate the first electrode layer 20, the second electrode layer 40, and the organic layer 30, thereby preventing vapor and oxygen from permeating and influencing the performance of OLED touch display substrate. Since the touch layer 80 in the embodiments of the present disclosure can also achieve the function of encapsulation together with the first insulating layer 90 in addition to the touch control function, no extra thin film encapsulation is needed on the OLED touch display substrate. In this way, the thickness of OLED touch display substrate can be reduced, the number of production processes can be decreased, and the production cost can be cut down.

Furthermore, in an embodiment of the present disclosure, the touch layer 80 is directly fabricated on the first insulating layer 90. In contrast with the relevant art, where the touch layer 80 is fabricated on the substrate first, and then the substrate 70 on which the touch layer 80 has been fabricated is bonded to the second electrode layer 40 by a layer of optical clear adhesive. No substrate or layer of optical clear adhesive is needed in the embodiments of the present disclosure. Therefore, the thickness of the OLED touch display substrate is further reduced. Besides, as compared with the conventional solution where glass is used for encapsulation, in an embodiment of the present disclosure, multiple layers of thin film are used for encapsulation. Therefore, the OLED touch display substrate is flexible. Besides, a reduced thickness of OLED touch display substrate is more favorable to the bending of OLED touch display substrate, thus improving the flexibility of OLED touch display substrate.

Optionally, as shown in FIG. 5, the material for the first insulating layer 90 is an inorganic material, and the material for the first protective layer 100 is an organic material. Furthermore, the above method further comprises: after forming the touch layer 80, forming a second insulating layer 120 on the touch layer 80, wherein the material for the second insulating layer 120 is an inorganic material.

Specifically, the materials for the first insulating layer 90 and the second insulating layer 120 can be either the same or different. Besides, the process for forming the first insulating layer 90 and the second insulating layer 120 can also be selected flexibly upon actual needs. For example, they can be formed by vacuum sputtering.

Continuing with the above embodiment, the first insulating layer 90 and the second insulating layer 120 can have any suitable thickness. Optionally, the first insulating layer 90 and the second insulating layer 120 can have a thickness of 1000 Å-1 µm. Further optionally, the first insulating layer 90 and the second insulating layer 120 can both have a thickness of 3000 Å.

Herein, since $SiN_x$, $SiO_x$ and $SiO_xN_y$ have better compactness as compared with other inorganic materials, in an embodiment of the present disclosure, the materials for the first insulating layer 90 and the second insulating layer 120 are optionally at least one of $SiN_x$, $SiO_x$ and $SiO_xN_y$.

In an embodiment of the present disclosure, the material for the first protective layer 100 is an organic material, while the materials for the first insulating layer 90 and the second insulating layer 120 are inorganic materials. Thereby, an inorganic-organic-inorganic stack structure can be formed. In this case, with the outermost layers made of inorganic materials having better compactness and the middle layer made of an organic material, the inorganic-organic-inorganic stack structure can effectively prevent the permeation of vapor, and thus ensures the service life of OLED touch display substrate.

Optionally, as shown in FIG. 6(a), the step of forming the touch layer 80 can specifically comprise sub-steps as follows.

S200, forming a plurality of first touch electrodes 801 extending in a first direction and a plurality of second touch electrodes 802 extending in a second direction, wherein the first direction is different from the second direction, and wherein each first touch electrode 801 comprises a plurality of first sub-touch electrodes 8011 connected directly to each other, and each second touch electrode 802 comprises a plurality of second sub-touch electrodes 8021 arranged at intervals.

Furthermore, the materials for the first touch electrode 801 and the second touch electrode 802 can be at least one of indium tin oxide (ITO), indium zinc oxide (IZO), and indium gallium zinc oxide (IGZO).

Herein, a conductive thin film can be formed first by a sputtering process, and then the first touch electrodes 801 and the second touch electrodes 802 can be formed by an exposure process and a developing process.

Besides, the thicknesses of the first touch electrode 801 and the second touch electrode 802 can be flexibly selected upon actual needs. Optionally, the first touch electrode 801 and the second touch electrode 802 can have a thickness of 450 Å-10000 Å. Further optionally, the first touch electrode 801 and the second touch electrode 802 can have a thickness of 1200 Å.

S201, forming a first protective layer 100.

Specifically, the first protective layer 100 can be formed by any suitable process. For example, it can be formed by a spray process. In view of above, the thickness of first protective layer 100 can be flexibly selected upon actual needs. For example, optionally, the first protective layer 100 has a thickness of 0.65 µm-20 µm. Further optionally, the first protective layer 100 has a thickness of 1.5 µm.

S202, forming a plurality of bridges 110, wherein each bridge 110 penetrates through a via hole in the first protective layer 100 to electrically connect adjacent second sub-touch electrodes 8021.

Herein, a conductive thin film can be formed first by a sputtering process, and then the bridges 110 can be formed by an exposure process, a developing process or an etching process.

Furthermore, the bridge 110 can be made of any suitable material. For example, the material for the bridge 110 can be a metal or a metal oxide. Besides, the material for the bridge 110 can be the same as or different from the materials for the first touch electrode 801 and the second touch electrode 802. When the material for the bridge 110 is a metal material, metal wires can be formed at the same time when the bridges 110 are formed. Alternatively, when the material for the bridge 110 is the same as the materials for the first touch electrode 801 and the second touch electrode 802, for example, is IZO or ITO, it is also necessary to form metal wires after the formation of bridges 110.

Besides, the bridges 110 can also be made with different thicknesses. Optionally, the bridges 110 have a thickness of 450 Å-10000 Å. Further optionally, the bridges 110 have a thickness of 1200 Å.

After step S103 and before step S104, the method further comprises: forming a second protective layer 130 on the first insulating layer 90, wherein the material for the second protective layer 130 is an organic material.

Specifically, the process for forming the second protective layer 130 can be a spray process for instance. In view of above, optionally, the second protective layer 130 has a thickness of 0.65 μm-20 μm. Further optionally, the second protective layer 130 has a thickness of 1.5 μm.

Herein, the materials for the second protective layer 130 and the first protective layer 100 can be either the same or different. The present disclosure is not limited thereto in this aspect.

In an embodiment of the present disclosure, the materials for the first insulating layer 90, the second insulating layer 120, the first touch electrodes 801 and the second touch electrodes 802 are all inorganic materials, while the materials for the first protective layer 100 and the second protective layer 130 are both organic materials. Therefore, when the OLED touch display substrate is structured in a manner of first insulating layer 90-second protective layer 130-first touch electrodes 801 and second touch electrodes 802-first protective layer 100-second insulating layer 120, the OLED touch display substrate has an inorganic-organic-inorganic-organic-inorganic stack structure. Besides, the outermost layers of the stack structure are made of inorganic materials having better compactness and the middle layers are made of organic materials. Therefore, the stack structure of inorganic-organic alternating multilayer can exclude vapor and oxygen more effectively, and hence greatly enhances the barrier properties against vapor and oxygen.

Optionally, as shown in FIG. 6(b), the step of forming the touch layer 80 specifically comprises processes as follows.

S300, forming bridges 110.

As an example, the bridges 110 can be made of any suitable material. For example, the material for the bridge 110 can be a metal or a metal oxide. Besides, the material for the bridge 110 can be the same as or different from the materials for the first touch electrode 801 and the second touch electrode 802. When the material for the bridge 110 is a metal material, metal wires can be formed at the same time when the bridges 110 are formed. When the material for the bridge 110 is the same as the materials for the first touch electrode 801 and the second touch electrode 802, for example, is IZO or ITO, it is also necessary to form metal wires after the formation of bridges 110.

Besides, the bridges 110 can also be made with different thicknesses. For example, optionally, the bridges 110 have a thickness of 450 Å-10000 Å. Further optionally, the bridges 110 have a thickness of 1200 Å.

S301, forming a first protective layer 100 on the bridges 110.

Herein, optionally, the first protective layer 100 can have a thickness of 0.65 μm-20 μm. Further optionally, the first protective layer 100 can have a thickness of 1.5 μm.

S302, forming a plurality of first touch electrodes 801 extending in a first direction and a plurality of second touch electrodes 802 extending in a second direction. Specifically, the first direction is different from the second direction. Besides, each first touch electrode 801 comprises a plurality of first sub-touch electrodes 8011 connected directly to each other, and each second touch electrode 802 comprises a plurality of second sub-touch electrodes 8021 arranged at intervals, wherein two adjacent second sub-touch electrodes 8021 are electrically connected via a bridge 110.

Besides, the thicknesses of the first touch electrode 801 and the second touch electrode 802 can be flexibly selected upon actual needs. For instance, optionally, the first touch electrode 801 and the second touch electrode 802 can have a thickness of 450 Å-10000 Å. Further optionally, the first touch electrode 801 and the second touch electrode 802 can have a thickness of 1200 Å.

After step S104 and before the formation of second insulating layer 120, the method further comprises: forming a second protective layer 130 on the touch layer 80, wherein the material for the second protective layer 130 is an organic material.

In an embodiment of the present disclosure, the materials for the first insulating layer 90, the second insulating layer 120, the first touch electrodes 801 and the second touch electrodes 802 are all inorganic materials, while the materials for the first protective layer 100 and the second protective layer 130 are both organic materials. Therefore, when the OLED touch display substrate is structured in a manner of first insulating layer 90-first protective layer 100-first touch electrodes 801 and second touch electrodes 802-second protective layer 130-second insulating layer 120, the OLED touch display substrate has an inorganic-organic-inorganic-organic-inorganic stack structure, where the outermost layers of the stack structure are made of inorganic materials having better compactness and the middle layers are made of organic materials. The stack structure of inorganic-organic alternating multilayer can exclude vapor and oxygen more effectively, and hence greatly enhances the barrier properties against vapor and oxygen.

The above description is only specific embodiments of the present disclosure, but the protection scope of the present disclosure is not limited thereto. Any variation or substitution easily conceivable within the technical scope disclosed in the present disclosure for a skilled person who is familiar with this technical field shall fall within the protection scope of the present disclosure. Therefore, the protection scope of the present disclosure shall be subject to the protection scope of the claims.

The invention claimed is:

1. An OLED touch display substrate, comprising:
   a first electrode layer and a second electrode layer opposite to each other;
   an organic layer between the first electrode layer and the second electrode layer;

a touch layer on a side of the second electrode layer facing away from the organic layer; and a first insulating layer between the touch layer and the second electrode layer, wherein the second electrode layer is a transparent electrode layer, and the touch layer comprises:

a first protective layer;

a plurality of first touch electrodes and a plurality of second touch electrodes on a side of the first protective layer facing away from the first insulating layer, the plurality of first touch electrodes extending in a first direction, and the plurality of second touch electrodes extending in a second direction different from the first direction, wherein each first touch electrode comprises a plurality of first sub-touch electrodes connected directly to each other, and each second touch electrode comprises a plurality of second sub-touch electrodes arranged at intervals;

a plurality of bridges located respectively at a plurality of intersections between the first touch electrodes and the second touch electrodes and arranged further on a side of the first protective layer opposite to the first touch electrodes and the second touch electrodes, each bridge electrically connecting two adjacent second sub-touch electrodes via a via hole in the first protective layer;

a second protective layer on a side of the first touch electrodes and the second touch electrodes facing away from the first protective layer, and further positioned between the first insulating layer and the second insulating layer;

wherein the plurality of first sub-touch electrodes and the plurality of second sub-touch electrodes are arranged on the side of the first protective layer facing away from the first insulating layer, and each second sub-touch electrode includes a portion filling the via hole and in direct contact with the corresponding bridge;

wherein the first protective layer is made of an organic material; the second protective layer is made of an organic material; the OLED touch display substrate further comprises a second insulating layer on a side of the touch layer facing away from the first insulating layer; the first insulating layer and the second insulating layer are both made of an inorganic material; and wherein the first insulating layer, the first protective layer, the first touch electrodes, the second touch electrodes, the second protective layer, and the second insulating layer form a stack structure of inorganic-organic-inorganic-organic-inorganic alternating multilayer, which achieves a function of thin film encapsulation without an additional encapsulation film.

2. The OLED touch display substrate according to claim 1, further comprising:

a polarizer on a side of the touch layer facing away from the first insulating layer.

3. A touch display device, comprising:

the OLED touch display substrate according to claim 1; and an encapsulation cover plate, wherein the OLED touch display substrate and the encapsulation cover plate are bonded via a layer of optical clear adhesive.

4. The touch display device according to claim 3, wherein the OLED touch display substrate further comprises:

a polarizer on a side of the touch layer facing away from the first insulating layer.

* * * * *

UNITED STATES PATENT AND TRADEMARK OFFICE
CERTIFICATE OF CORRECTION

PATENT NO. : 11,367,757 B2
APPLICATION NO. : 16/096902
DATED : June 21, 2022
INVENTOR(S) : Jun Li Page 1 of 1

It is certified that error appears in the above-identified patent and that said Letters Patent is hereby corrected as shown below:

On the Title Page

Item (71) HEFEI XINSHENG OPTOELECTRONICS TECHNOLOGY CO., LTD should read
---HEFEI XINSHENG OPTOELECTRONICS TECHNOLOGY CO., LTD.---.

Signed and Sealed this
Twenty-sixth Day of September, 2023

Katherine Kelly Vidal
*Director of the United States Patent and Trademark Office*